(12) United States Patent
Yamanaka et al.

(10) Patent No.: US 8,922,118 B2
(45) Date of Patent: Dec. 30, 2014

(54) LIGHT-EMITTING DEVICE

(71) Applicant: Panasonic Corporation, Osaka (JP)

(72) Inventors: Kazuhiko Yamanaka, Osaka (JP);
Shinji Yoshida, Shiga (JP); Shinichi Takigawa, Osaka (JP); Takuma Katayama, Kyoto (JP); Hideyuki Nakanishi, Osaka (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/141,102

(22) Filed: Dec. 26, 2013

(65) Prior Publication Data

US 2014/0103798 A1   Apr. 17, 2014

Related U.S. Application Data

(63) Continuation of application No. PCT/JP2012/001691, filed on Mar. 12, 2012.

(30) Foreign Application Priority Data

Jun. 30, 2011   (JP) .................................. 2011-146799

(51) Int. Cl.
| | |
|---|---|
| *H01L 51/50* | (2006.01) |
| *H05B 33/04* | (2006.01) |
| *H01L 33/48* | (2010.01) |
| *H01L 33/50* | (2010.01) |
| *H01L 25/075* | (2006.01) |
| *H01L 33/58* | (2010.01) |

(52) U.S. Cl.
CPC .............. *H05B 33/04* (2013.01); *H01L 33/486* (2013.01); *H01L 33/504* (2013.01); *H01L 25/0753* (2013.01); *H01L 33/502* (2013.01); *H01L 33/58* (2013.01); *H01L 2933/0033* (2013.01); *H01L 2224/83192* (2013.01); *H01L 2224/48091* (2013.01); *H01L 2224/73265* (2013.01); *H01L 2224/49107* (2013.01); *H01L 2224/45144* (2013.01)
USPC .......................................... 313/512; 313/310

(58) Field of Classification Search
USPC ....................................................... 313/512
See application file for complete search history.

(56) References Cited

U.S. PATENT DOCUMENTS

| | | |
|---|---|---|
| 7,573,190 B2 | 8/2009 | Hirosaki et al. |
| 7,923,918 B2 | 4/2011 | Tamaki et al. |
| 8,148,887 B2 | 4/2012 | Hirosaki et al. |

(Continued)

FOREIGN PATENT DOCUMENTS

| | | |
|---|---|---|
| JP | 2005-116817 A | 4/2005 |
| JP | 2005-235934 A | 9/2005 |
| JP | 3931239 B2 | 6/2007 |
| JP | 2009-140835 A | 6/2009 |
| JP | 2009-206459 A | 9/2009 |
| JP | 2011-029380 A | 2/2011 |
| WO | 2004/081140 A1 | 9/2004 |
| WO | 2010/123059 A1 | 10/2010 |

OTHER PUBLICATIONS

International Search Report issued in International Application No. PCT/JP2012/001691 mailed Apr. 3, 2012, 2 pgs.

*Primary Examiner* — Mary Ellen Bowman
(74) *Attorney, Agent, or Firm* — McDermott Will & Emery LLP

(57) ABSTRACT

A light-emitting device includes: a package; a semiconductor light-emitting element mounted above the package; a cap component provided above the package; a sealing component which seals a space between the package and the cap component; and a phosphor containing resin including phosphor disposed in the sealed space.

20 Claims, 15 Drawing Sheets

(56) References Cited

U.S. PATENT DOCUMENTS

| | | | |
|---|---|---|---|
| 2003/0170496 A1* | 9/2003 | Hieda et al. | 428/690 |
| 2006/0170332 A1 | 8/2006 | Tamaki et al. | |
| 2007/0159091 A1 | 7/2007 | Hirosaki et al. | |
| 2007/0267976 A1* | 11/2007 | Bohler et al. | 315/112 |
| 2009/0167153 A1 | 7/2009 | Hirosaki et al. | |
| 2009/0224177 A1 | 9/2009 | Kinomoto et al. | |
| 2010/0020264 A1* | 1/2010 | Ohkawa | 349/62 |
| 2014/0021503 A1* | 1/2014 | Yoshida et al. | 257/98 |

* cited by examiner

FIG. 3E
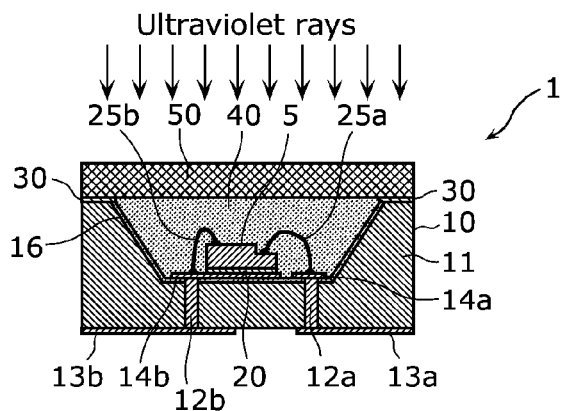
FIG. 4A
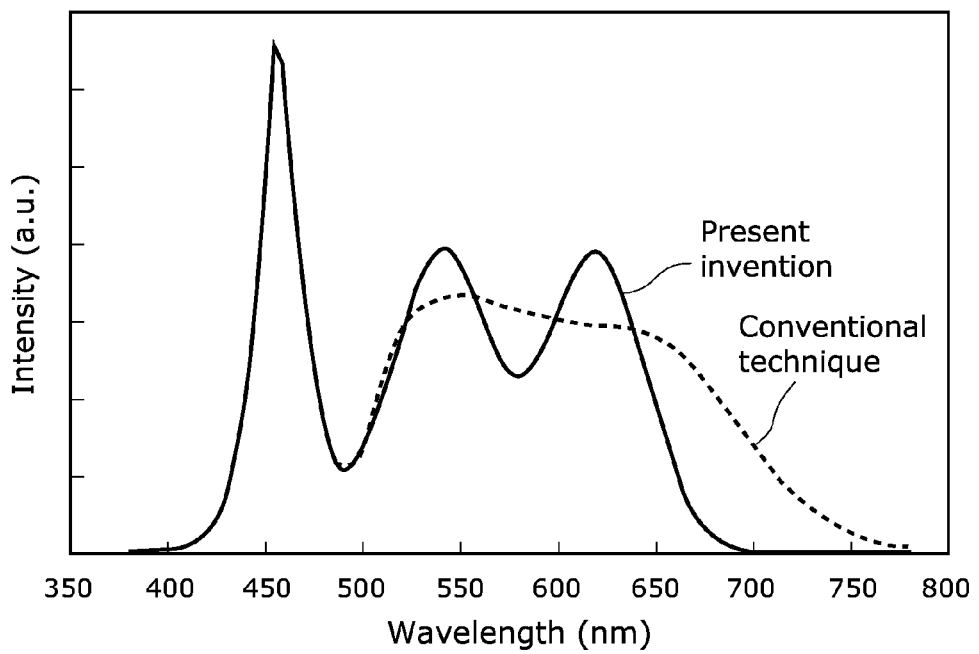
FIG. 4B
|  | Conventional example | Present invention |
|---|---|---|
| Chromaticity coordinates | x = 0.338, y = 0.334 | x = 0.338, y = 0.338 |
| Average color rendering index | 92 | 94 |

Ultraviolet rays

|  | Conventional example | Present invention |
|---|---|---|
| Chromaticity coordinates | x = 0.338, y = 0.334 | x = 0.336, y = 0.333 |
| Average color rendering index | 92 | 92 |

LIGHT-EMITTING DEVICE

CROSS REFERENCE TO RELATED APPLICATION

This is a continuation application of PCT International Application No. PCT/JP2012/001691 filed on Mar. 12, 2012, designating the United States of America, which is based on and claims priority of Japanese Patent Application No. 2011-146799 filed on Jun. 30, 2011. The entire disclosures of the above-identified applications, including the specifications, drawings and claims are incorporated herein by reference in their entirety.

FIELD

The present invention relates to light-emitting devices in which semiconductor light-emitting elements and phosphor are combined, and particularly to a light-emitting device for lighting and a backlight source for a thin-screen television.

BACKGROUND

Recent years have seen that the existing incandescent light bulbs and fluorescent lamps are being replaced at a rapid pace by light-emitting devices, such as white light emitting diodes that are obtained by combining semiconductor light-emitting elements, which are used for blue light emitting diodes, and yellow phosphor that emits yellow fluorescence. These light-emitting devices have achieved increase in efficiency to have power-to-light conversion efficiency exceeding 100 lm/W and have been made available in various sizes, such as with a package size of 5 mm$^2$ to 100 mm$^2$, at reasonable prices. As a result, the light-emitting devices come into wide use rapidly.

On the other hand, there is a problem of poor color rendition, because the light emitted from these white light emitting diodes is pseudo white light obtained by combining blue light and yellow light.

In view of this, for example, Patent Literature (PTL) 1 and 2 present a light-emitting device in which, in addition to a first phosphor that emits yellow right with blue semiconductor light-emitting device that emits blue light, second phosphor, which emits red light, mixed with the first phosphor is applied on the blue semiconductor light-emitting element. The following describes conventional light-emitting devices with reference to FIG. 16 and FIG. 17.

In this conventional example, a first phosphor particle is a phosphor particle of yttrium aluminum garnet type, and a second phosphor particle is a phosphor particle including $CaAlSiN_3$ crystal activated with Eu.

A light-emitting device 1021 that is of a chip type white light emitting diode lamp includes a white alumina ceramics substrate 1029 having high reflectance against visible light. Two lead wires 1022 and 1023 are fixed to the alumina ceramic substrate 1029, and one end of each of the wires is located in a substantially center area of the substrate, and the other end of each of the wires extends to outside to serve as an electrode to be soldered at the time of mounting to an electric board. A blue light emitting diode element 1024 is placed and fixed on one end of the lead wire 1022 in the center area of the substrate. A lower electrode of the blue light emitting diode element 1024 and the lead wire 1022 below the lower electrode are electrically connected with conductive paste, and an upper electrode and the lead wire 1023 are electrically connected through a thin gold wire 1025.

Phosphor 1027, which is obtained by mixing a first resin and second phosphor, is dispersed in first resin 1026, and is provided near the blue light emitting diode element 1024. The first resin 1026 including the dispersed phosphor 1027 is transparent, and covers the entire blue light emitting diode element 1024. Furthermore, a wall member 1030, which is a white silicone resin, is fixed on the alumina ceramics substrate 1029. The wall member 1030 is in a shape including a hole in the center area, and includes a tilted face having a curved shape at a portion facing the center. The titled face is a reflector for guiding light toward the front. The hole in the center area of the wall member 1030 is a recess in which transparent second resin 1028 is filled to seal all the blue light emitting diode element 1024 and the first resin 1026 including the dispersed phosphor 1027. The first resin 1026 and the second resin 1028 include the same epoxy resin. With this structure, a spectrum indicated by a solid line shown in FIG. 17 is obtained from the light-emitting device 1021, and the chromaticity coordinates of x=0.338, and y=0.330 are obtained.

However, the light-emitting device according to the conventional technique has the following problem. Specifically, in the spectrum shown in FIG. 17, light emission in red to infrared region exists. However, as indicated by a visibility curve shown as a dotted line, human eyes have low sensitivity to the light having a wavelength greater than or equal to 680 nm, and thus such light does not contribute to the brightness of the light-emitting device. Furthermore, for the light in this region, Stokes shift at the time of conversion from blue light, which is excitation light, is great. Consequently, the conversion loss is significant. In view of this, PTL 2 presents a light-emitting device having a structure that uses quantum dot phosphor which can control the peak wavelength and has a narrow full-width at half-maximum in the spectrum, to achieve efficient controlling of light spectrum in the red to infrared region.

CITATION LIST

Patent Literature

[PTL 1] Japanese Unexamined Patent Application Publication No. 2005-235934
[PTL 2] Japanese Unexamined Patent Application Publication No. 2011-29380

SUMMARY

Technical Problem

However, the light-emitting device according to the conventional technique has a following problem. Specifically, quantum dot phosphor is vulnerable to gas and moisture. To address this problem, a conventional example describes a liquid curable resin composition that can reduce deterioration of the quantum dot phosphor, and a light-emitting device having a structure that uses the liquid curable resin composition. However, along with the increase in reliability of the semiconductor light-emitting elements and peripheral materials in recent years, a structure which can further reduce the deterioration of quantum dot phosphor is also anticipated.

In view of this, the present invention has an object of presenting a light-emitting device which can reduce the deterioration of phosphor in a light-emitting device that include a semiconductor light-emitting element and phosphor.

Solution to Problem

In order to achieve the above-described object, a light-emitting device according to an aspect of the present invention is a light-emitting device which includes: a package; a semiconductor light-emitting element mounted above the package; a cap component provided above the package; a sealing component which seals a space between the package and the cap component; and phosphor disposed in the sealed space. With this structure, even in the case of phosphor which is vulnerable to gas and moisture, it becomes easy to seal the phosphor in a hermetical manner with a component having high gas barrier properties. Thus, deterioration of phosphor can be reduced.

In the light-emitting device according to an aspect of the present invention, a cavity including gas may be formed in the sealed space. With this structure, when sealing the phosphor, the volume of a component including the phosphor becomes smaller than the volume of a space which is sealed. This makes it possible to reduce the chance for the component including the phosphor to enter a seal region sealed with the sealing component. Thus, the phosphor can be hermetically sealed in an efficient manner.

In the light-emitting device according to an aspect of the present invention, the cavity may include gas other than oxygen or may be a vacuum. With this structure, a bubble which remains in the sealed region is gas different from oxygen. Thus, the deterioration of the phosphor due to oxidation can be reduced.

In the light-emitting device according to an aspect of the present invention, the package may have a structure in which a metal line is embedded in a ceramic material. With this structure, the package comprises a ceramic material and the metal material which have high gas barrier properties. Thus, it becomes possible to seal the phosphor with a component having high gas barrier properties.

In the light-emitting device according to an aspect of the present invention, the cap component may comprise a translucent acrylic resin or a translucent epoxy resin. With this structure, the package comprises a transparent resin material having high gas barrier properties. Thus, it becomes possible to seal the phosphor with a component having high gas barrier properties.

In the light-emitting device according to an aspect of the present invention, the cap component may comprise translucent glass. With this structure, the package comprises a glass material having high gas barrier properties. Thus, it becomes possible to seal the phosphor with a component having high gas barrier properties.

In the light-emitting device according to an aspect of the present invention, a surface of at least one of the cap component and the package may be treated to be water repellent, the surface being a surface facing the semiconductor light-emitting element. With this structure, a cavity which exists in the sealed region of the light-emitting device can be arbitrarily placed in a predetermined region.

In the light-emitting device according to an aspect of the present invention, the phosphor may include a plurality of types of phosphor particles. With this structure, the phosphor includes, for example, phosphor materials having a plurality of wavelength regions. This makes it possible to freely design chromaticity coordinates and an average color rendering index (color rendition) to suit an application.

In the light-emitting device according to an aspect of the present invention, the phosphor may be quantum dot phosphor. In this structure, the phosphor can be quantum dot phosphor having a narrow full-width at half-maximum in the spectrum and capable of freely adjusting the peak wavelength. This structure can also prevent the quantum dot phosphor from deterioration due to gas and moisture.

In the light-emitting device according to an aspect of the present invention, the phosphor of the types may be enclosed in the sealed region. With this structure, it is possible to prevent the phosphor of the types from deteriorating due to gas and moisture.

In the light-emitting device according to an aspect of the present invention, at least one of types of the phosphor may include a rare-earth activated phosphor material. With this structure, the phosphor can be a rare-earth activated phosphor material which deteriorates slightly due to gas and moisture. This makes it possible to freely dispose the phosphor and freely design the structure of the light-emitting device.

In the light-emitting device according to an aspect of the present invention, the phosphor may be mixed into different resin materials. With this structure, different phosphor can be mixed into a different resin material. This makes it possible to freely design the structure of the light-emitting device.

In the light-emitting device according to an aspect of the present invention, the cap component may include phosphor. With this structure, the light-emitting device can be configured using the cap component that includes in advance the phosphor. Thus, the light-emitting device can be obtained more easily.

Advantageous Effects

A light-emitting device according to the present invention makes it possible to easily seal phosphor in a hermetical manner with a component having high gas barrier properties, and thus can reduce deterioration of phosphor even in the case of a light-emitting device using phosphor which is vulnerable to gas and moisture.

BRIEF DESCRIPTION OF DRAWINGS

These and other objects, advantages and features of the invention will become apparent from the following description thereof taken in conjunction with the accompanying drawings that illustrate a specific embodiment of the present invention.

FIG. 3E is a cross-sectional view showing a method for manufacturing the light-emitting device according to Embodiment 1 of the present invention.

FIG. 4A is a graph showing an emission spectrum of the light-emitting device according to Embodiment 1 of the present invention.

FIG. 4B is a table which shows chromaticity coordinates and average color rendering index of the light-emitting device according to Embodiment 1 of the present invention.

DESCRIPTION OF EMBODIMENTS

Figure 1:
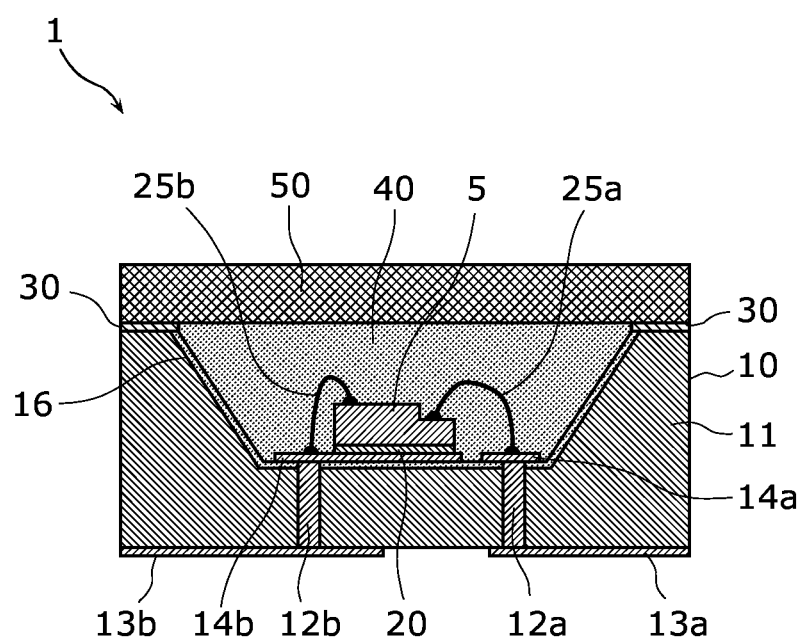
FIG. 1 is a cross-sectional view showing a structure of a light-emitting device according to Embodiment 1 of the present invention.

The following describes embodiments of the present invention with reference to drawings. It should be noted that each of the embodiments described hereafter illustrates a preferred specific example of the present invention. The numerical values, shapes, materials, structural elements, the arrangement and connection of the structural elements, manufacturing processes, the processing order of the manufacturing processes etc. shown in the following embodiments are mere examples, and therefore do not intend to limit the inventive concept. The present invention is only limited by the Claims. Therefore, among the structural elements in the following embodiments, those structural elements which are not described in the independent claim indicating the broadest concept of the present invention are not necessarily required in order to achieve the object of the present invention but are described as elements for configuring a more preferable embodiment. Furthermore, in the drawings, structural elements of the substantially same structure, operation, and effect are denoted by the same reference sign.

Embodiment 1

The following describes a light-emitting device according to Embodiment 1 of the present invention with reference to FIG. 1 to FIG. 3E.

First, a structure of the light-emitting device according to Embodiment 1 of the present invention is described with reference to FIG. 1.

FIG. 1 is a cross-sectional view showing a structure of a light-emitting device 1 according to this embodiment.

The light-emitting device 1 includes: a semiconductor light-emitting element 5 mounted above a package 10, the package 10, a bonded part 20, bonding wires 25a and 25b, a sealing component 30 which seals a space between the package 10 and a cap component 50, a phosphor containing resin 40 which includes phosphor and is arranged in a space sealed with the sealing component 30, and the cap component 50 provided above the package 10. The package 10 includes: a base material 11, via lines 12a and 12b, back side electrodes 13a and 13b, front side electrodes 14a and 14b, and a reflection film 16. The package 10 has, for example, a structure including a ceramic material in which a metal line is embedded. The cap component 50 comprises, for example, a translucent acrylic resin, a translucent epoxy resin, or translucent glass. The phosphor of the phosphor containing resin 40 includes, for example, a plurality of types of phosphor particle. The phosphor included in the phosphor containing resin 40 is, for example, quantum dot phosphor. For example, phosphor of the types included in the phosphor containing resin 40 is enclosed in a region sealed with the sealing component 30. For example, at least one type of the phosphor of the phosphor containing resin 40 includes a rare-earth activated phosphor material.

In the package 10, a recess for disposing the semiconductor light-emitting element 5 is formed in the base material 11, and the reflection film 16 is formed on a base of the recess and on a side surface, which is formed of a tilted face (side surface), of the recess. The reflection film 16 is for reflecting the light emitted from the semiconductor light-emitting element 5 and the fluorescence emitted from the phosphor containing resin 40. On the base of the recess, the front side electrodes 14a and 14b for providing the semiconductor light-emitting element 5 with electricity are formed. The front side electrodes 14a and 14b are connected to the back side electrodes 13a and 13b, which are formed on the bottom surface of the base material 11, through the via lines 12a and 12b embedded in the base material 11.

The semiconductor light-emitting element 5 is obtained by depositing, for example, a P-type nitride semiconductor layer and an N-type nitride semiconductor layer which include a material such as a nitride semiconductor or the like that is nitride of gallium (Ga), indium (In), aluminum (Al), or the like, on one of the substrates among a sapphire substrate, a silicon carbide (SiC) substrate, gallium nitride (GaN) substrate, and a silicon (Si) substrate. Then, the semiconductor light-emitting element 5 emits light having a wavelength from 350 nm to 500 nm. The semiconductor light-emitting element 5 is bonded to the top of the front side electrode 14b through the bonded part 20. Then, the P-type nitride semiconductor layer and the N-type nitride semiconductor layer are connected to the front side electrodes 14a and 14b through the bonding wires 25a and 25b, respectively. Thus, electricity is supplied to each of the layers from outside. On a top-most portion of an edge portion on the periphery of the package 10, the sealing component 30 which is, for example, an epoxy adhesive is disposed. The sealing component 30 seals the phosphor containing resin 40 which is disposed to cover the semiconductor light-emitting element 5. Stated differently, the sealing component 30 seals a space between the package 10 and the cap component 50 which comprises, for example, glass (a space in the recess of the base material 11 covered with the cap component 50).

The cap component 50 is a component transparent to the light emitted from the semiconductor light-emitting element 5 and to fluorescence from the phosphor containing resin 40 to extract, to outside, the light emitted from the semiconductor light-emitting element 5 and the phosphor light (fluorescence) from the phosphor containing resin 40.

The phosphor containing resin 40 is obtained by dispersing in resin, such as acrylic resin or the like, core shell quantum dot phosphor which includes, for example, InP as a core and ZnS as a shell. In this embodiment, particularly, the phosphor containing resin 40 includes a mixture of two types of quantum dot phosphor. The peak wavelength of fluorescence of one type of the quantum dot phosphor is from 500 nm to 570 nm, and the peak wavelength of fluorescence of the other type of the quantum dot phosphor is from 570 nm to 680 nm. In this case, the quantum dot phosphor of two types can be formed by changing the size and thickness of InP and ZnS which are materials of the core and the shell.

Next, an example of a design of the light-emitting device 1 according to this embodiment is described with reference to FIG. 2A and FIG. 2B.

Figure 2A:
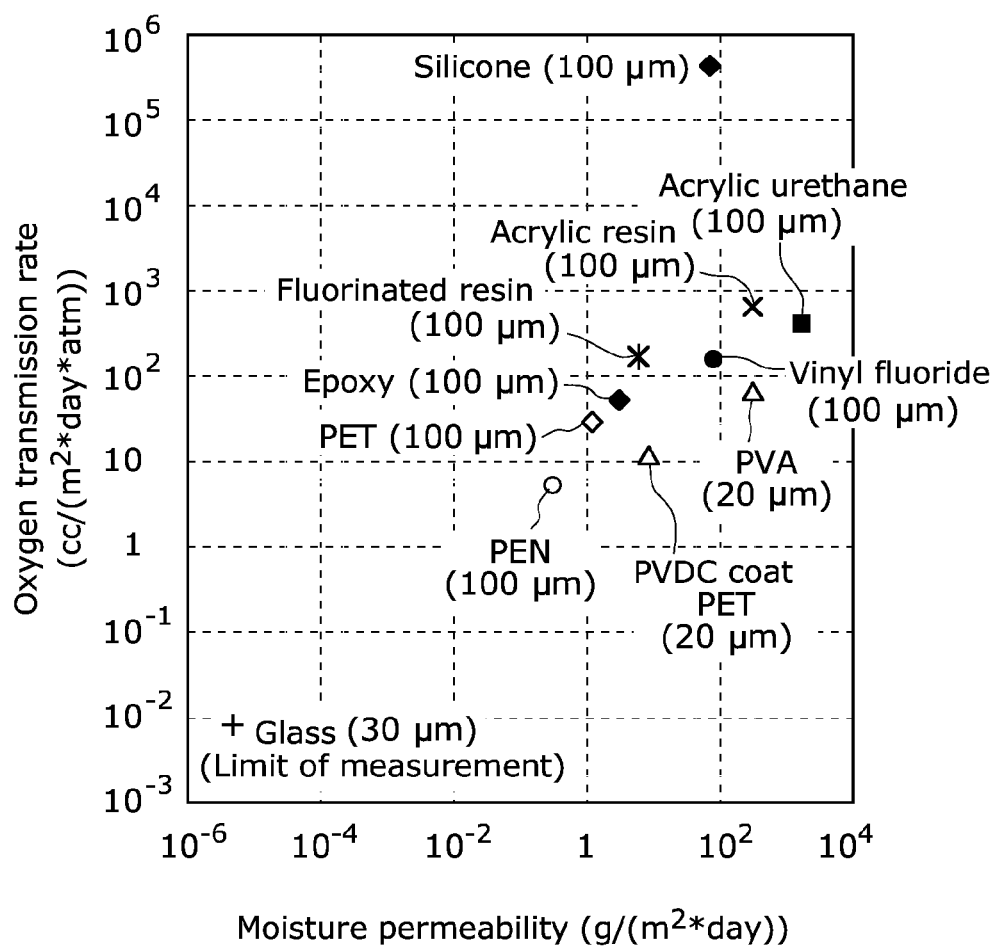
FIG. 2A is a diagram showing oxygen permeability and moisture permeability of transparent resin materials.

FIG. 2A is a graph which plots oxygen permeability (oxygen transmission rate) and moisture permeability of various resin materials and glass material. In this graph, a material which has particularly high oxygen permeability is silicone (having a film thickness of 100 μm, for example), materials having relatively low oxygen permeability are an epoxy resin (having a film thickness of 100 μm, for example) and an acrylic resin (having a film thickness of 100 μm, for example). Furthermore, oxygen permeability of glass (having a film thickness of 30 μm, for example), which is an inorganic material, is significantly low and is below detection limit.

Figure 2B:
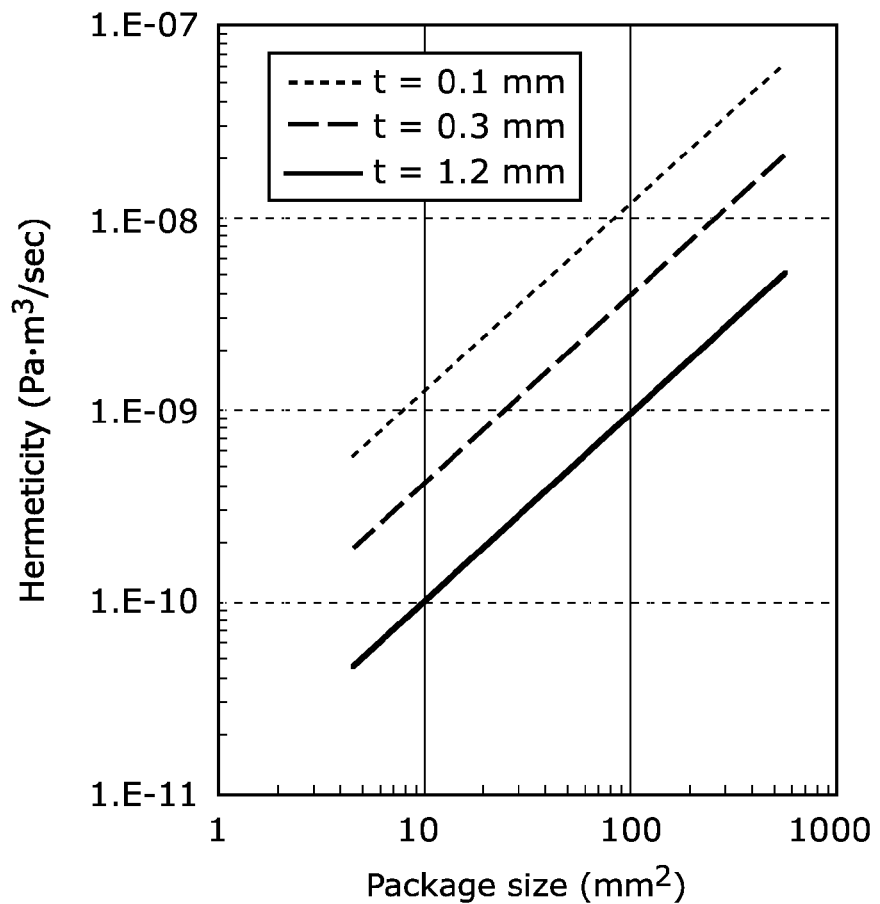
FIG. 2B is a graph which showing hermeticity of the light-emitting device according to Embodiment 1 of the present invention.

FIG. 2B is a graph plotting the cases in which thickness t of the cap component 50 is changed as a parameter, where the horizontal axis indicates a package size (an area of the package 10 seen from above in FIG. 1), and the vertical axis indicates hermeticity of the inside of the light-emitting device 1 (hermeticity of the space inside the recess of the package 10). In this case, the material of the cap component 50 is an epoxy resin having oxygen permeability of 50 cc/(m$^2$*day*atm). Assuming that the required hermeticity is $10^{-9}$ Pa·m$^3$/sec, FIG. 2B indicates that the cap component 50 may be designed to have a thickness greater than or equal to 0.1 mm when the package size is 5 mm$^2$, and a thickness greater than or equal to 1.2 mm when the package size is 100 mm$^2$. As described, when the material and thickness of the cap component 50 and the size of the package 10 are optimized with the structure according to this embodiment, the light-emitting device 1 having high hermeticity can be realized. This makes it possible to reduce deterioration of the enclosed phosphor.

Next, a method for manufacturing the light-emitting device 1 according to this embodiment is described with reference to FIG. 3A to FIG. 3E.

Each of FIG. 3A to FIG. 3E is a cross-sectional view showing a method of manufacturing the light-emitting device 1 according to this embodiment.

Figure 3A:
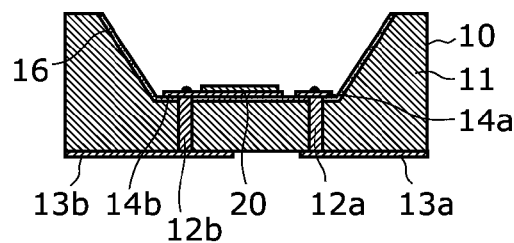
FIG. 3A is a cross-sectional view showing a method for manufacturing the light-emitting device according to Embodiment 1 of the present invention.

First, the package 10 is prepared, and the bonded part 20 is formed above the front side electrodes 14a and 14b which are provided in the recess of the package 10. The bonded part 20 is, for example, a gold tin (AuSn) alloy formed, for example, by bump plating (FIG. 3A).

Figure 3B:
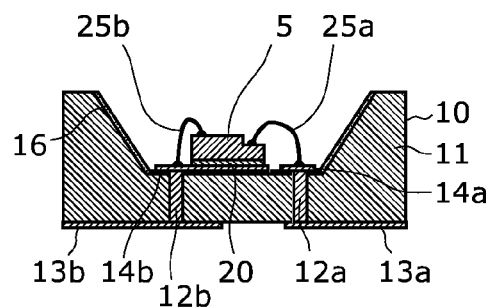
FIG. 3B is a cross-sectional view showing a method for manufacturing the light-emitting device according to Embodiment 1 of the present invention.

Subsequently, the semiconductor light-emitting element 5, which has a gold (Au) layer on the bottom surface of the substrate, is bonded to the package 10 through the bonded part 20 with pressing and heating, and the semiconductor light-emitting element 5 and the front side electrodes 14a and 14b are electrically connected through the bonding wires 25a and 25b (FIG. 3B).

Figure 3C:
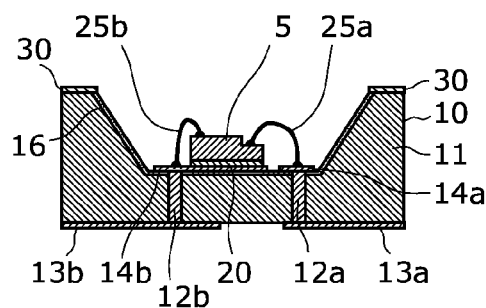
FIG. 3C is a cross-sectional view showing a method for manufacturing the light-emitting device according to Embodiment 1 of the present invention.

Subsequently, on the top-most portion of the edge portion on the periphery of the package 10, the sealing component 30 which is, for example, an ultraviolet curable epoxy adhesive is formed (applied) by potting to surround the recess (FIG. 3C).

Figure 3D:
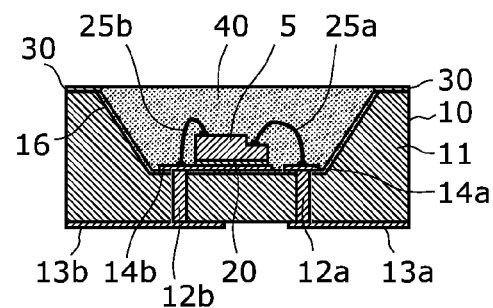
FIG. 3D is a cross-sectional view showing a method for manufacturing the light-emitting device according to Embodiment 1 of the present invention.

Subsequently, the package 10 is set in an atmosphere, such as nitrogen atmosphere or the like, which includes little oxygen. After this, the phosphor containing resin 40 comprising an ultraviolet curable acrylic resin into which two types of quantum dot phosphor are mixed is dribbled to embed the semiconductor light-emitting element 5 in the recess of the package 10 (i.e., to cover the semiconductor light-emitting element 5 in the recess) and to fill the recess (i.e., recess is filled with the phosphor containing resin 40) (FIG. 3D).

Subsequently, the cap component 50, such as glass or the like, is placed from above the package 10, and the sealing component 30 and the phosphor containing resin 40 are irradiated with ultraviolet rays through the cap component 50. The sealing component 30 and the phosphor containing resin 40 are thus cured (FIG. 3E). With this, the light-emitting device 1 shown in FIG. 1 is obtained.

Next, a characteristic of the light-emitting device 1 according to this embodiment is described based on FIG. 4A which shows results of calculation of the emission spectrum. In the calculation in FIG. 4A, it is assumed that (i) the peak wavelength of light emitted from the semiconductor light-emitting element 5 is 450 nm, (ii) the phosphor containing resin 40 includes two types of phosphor, (iii) the phosphor of one type has the peak wavelength of fluorescence of 540 nm and a full-width at half-maximum of the emission spectrum of 60 nm, and (iv) the phosphor of the other type has the peak wavelength of fluorescence of 620 nm, and a full-width at half-maximum of the emission spectrum of 60 nm. The amount of the two types of phosphor is adjusted and chromaticity coordinates x=0.338, and y=0.338 which are substantially the same chromaticity coordinates as a conventional technique is achieved as shown in FIG. 4B. At this time, typically, a technique is available that makes trade-off in the average color rendering index, which is color reproducibility of spectrum, to increase efficiency to achieve emission spectrum having high conversion efficiency. In contrast, it is shown that the present invention has the average color rendering index greater than or equal to the average color rendering index of the conventional technique. Note that, the spectrum of the conventional technique in FIG. 4A is obtained by the inventors as a result of calculation using a known parameter. Compared with the spectrum of the conventional technique, in the spectrum according to the present invention shown in FIG. 4A, light having a wavelength greater than or equal to 680 nm is barely emitted. From the above, it is indicated that, compared with the conventional light-emitting device, the present invention makes it possible to increase luminous efficacy of the light-emitting device without lowering the average color rendering index of the light-emitting device.

With the above-described structure and the manufacturing method, even when the phosphor included in the light-emitting device 1 is a material vulnerable to gas and moisture, the phosphor can be easily sealed in a space in the package 10 having high gas barrier properties (i.e., the space between the package 10 and the cap component 50). This makes it possible to reduce deterioration of the phosphor.

Note that, although this embodiment described, as the phosphor containing resin 40, core shell quantum dot phosphor including InP and ZnS, the phosphor is not limited to the above. For example, phosphor of a compound semiconductor, which has a diameter in nano scale, may be used. For example, the phosphor may include a compound semiconductor, such as InP, ZnS, ZnSe, CdS, CdSe, GaN, AlN, GaAs, InAs, AlAs, GaP, or the like. Furthermore, in the case of the core shell quantum dot phosphor, the core shell quantum dot phosphor may include two types of compound semiconductors from among the above-described compound semiconductors. Furthermore, the phosphor may be rare-earth activated quantum dot phosphor obtained by adding, to the above-described compound semiconductors, a rare-earth element, such as Ce, Eu, Mn, Tm, or the like.

Furthermore, although the phosphor containing resin 40 includes two types of phosphor in this embodiment, the structure is not limited to the above. It is sufficient that the phosphor containing resin 40 include one or more types of phosphor. Furthermore, although the acrylic resin is described as the resin material of the phosphor containing resin 40, the resin material is not limited to this. The resin material included in the phosphor containing resin 40 may be, for example, transparent resin, such as silicone, epoxy, or the like. Furthermore, although the glass is described as the material of the cap component 50, the material is not limited to this. For example, the cap component 50 may comprise a transparent resin, such as acrylic resin, epoxy, silicone, or the like, which has a predetermined thickness to ensure gas barrier properties.

Furthermore, although this embodiment described that the bonded part 20 is gold tin alloy, the structure is not limited to this. For example, when a material such as a silver paste or the like is used for the bonded part 20, the light-emitting device 1 can be easily manufactured.

Furthermore, although the resin included in the phosphor containing resin 40 in this embodiment is an ultraviolet curable acrylic resin, the resin is not limited to the above. For example, two-part epoxy or two-part silicone may be used for the resin included in the phosphor containing resin 40, and may be cured in a low temperature approximate range of room temperature to 100 degrees Celsius. Furthermore, depending on the heat resistance of the phosphor, one-part epoxy or silicone may be used for the resin included in the phosphor containing resin 40, and may be cured at approximately 150 degrees Celsius.

Embodiment 2

Next, a light-emitting device according to Embodiment 2 of the present invention is described with reference to FIG. 5 to FIG. 7D. The basic structure of the light-emitting device according to this embodiment is substantially the same as the structure of a light-emitting device according to Embodiment 1. Thus, descriptions are given only on the differences.

First, a structure of the light-emitting device according to Embodiment 2 of the present invention is described with reference to FIG. 5.

Figure 5:
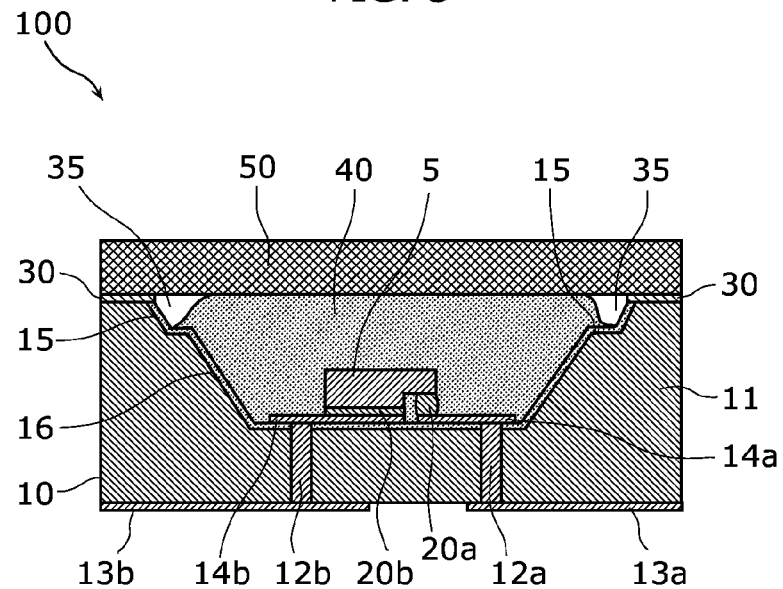
FIG. 5 is a cross-sectional view showing a structure of a light-emitting device according to Embodiment 2 of the present invention.

FIG. 5 is a cross-sectional view showing a structure of a light-emitting device 100 according to this embodiment.

The light-emitting device 100 includes: a semiconductor light-emitting element 5, a package 10, bonded parts 20a and 20b, a sealing component 30, a phosphor containing resin 40, and a cap component 50. The package 10 includes: a base material 11, via lines 12a and 12b, back side electrodes 13a and 13b, front side electrodes 14a and 14b, and a reflection film 16. For example, in the space sealed with the sealing component 30, a cavity (bubble) 35 including gas is formed. Then, for example, the cavity 35 includes gas other than oxygen or is a vacuum. For example, a surface of at least one of the cap component 50 and the package 10 facing the semiconductor light-emitting element 5 (i.e., at least one of (i) a surface, which faces the recess, of the cap component 50, and (ii) the base and side surface of the recess of the package 10) is treated to be water repellent.

In the package 10, in order to dispose the semiconductor light-emitting element 5 and to form a relief shape, which is for allowing the bubble to escape to the periphery in the recess to form the cavity 35 as described later, the base material 11 is formed to include a step portion 15 in the upper part of the tilted face within the recess near the opening. The reflection film 16 is formed on the base, on the step portion 15, and on the tilted face of the recess. The reflection film 16 is for reflecting light emitted from the semiconductor light-emitting element 5 and the fluorescence emitted from the phosphor containing resin 40. Furthermore, the surface of the reflection film 16 is treated with fluoride resin or the like to repel water to allow resin to be repelled easily as described later. On the base of the recess, the front side electrodes 14a and 14b for providing the semiconductor light-emitting element 5 with electricity are formed. The front side electrodes 14a and 14b are connected to the back side electrodes 13a and 13b, which are formed on the bottom surface of the base material 11, through the via lines 12a and 12b embedded in the base material 11.

The semiconductor light-emitting element 5 according to this embodiment has substantially the same structure as a semiconductor light-emitting element 5 according to Embodiment 1. However, a method for mounting the semiconductor light-emitting element 5 to the package 10 is significantly different from the method according to Embodiment 1.

The semiconductor light-emitting element 5 according to this embodiment is, for example, a light emitting diode in which nitride semiconductor layer is deposited on a transparent substrate, such as a sapphire substrate, a silicon carbide (SiC) substrate, a gallium nitride (GaN) substrate, or the like. The semiconductor light-emitting element 5 according to this embodiment is a semiconductor light emitting diode which emits light having a wavelength from 350 nm to 500 nm. The semiconductor light-emitting element 5 according to this embodiment is mounted using what is called a face-down mounting technique with bump bonding. More specifically, through the bump electrodes provided on the front side electrodes 14a and 14b, the front side electrodes 14a and 14b are electrically connected to a P-type nitride semiconductor layer and an N-type nitride semiconductor layer, and the semiconductor light-emitting element 5 is supplied with electricity from outside.

On a top-most portion of an edge portion on the periphery of the package 10, the sealing component 30 which is, for example, an epoxy adhesive is disposed. The sealing component 30 seals the phosphor containing resin 40 which is disposed to cover the semiconductor light-emitting element 5. Stated differently, the sealing component 30 seals a space between the package 10 and the cap component 50 which comprises glass or a transparent resin, such as acrylic resin or the like (i.e., the space in the recess of the base material 11 covered with the cap component 50). At this time, the surface of the cap component 50 on the side of the phosphor containing resin 40 is treated, for example, with fluoride resin to repel water. Furthermore, the phosphor containing resin 40 is disposed in a manner to create the cavity 35, which substantially includes nitrogen component for example, in the upper part of the second-step recess on the side surface of the recess.

Next, operations of the light-emitting device 100 according to this embodiment are described with reference to FIG. 6.

Figure 6:
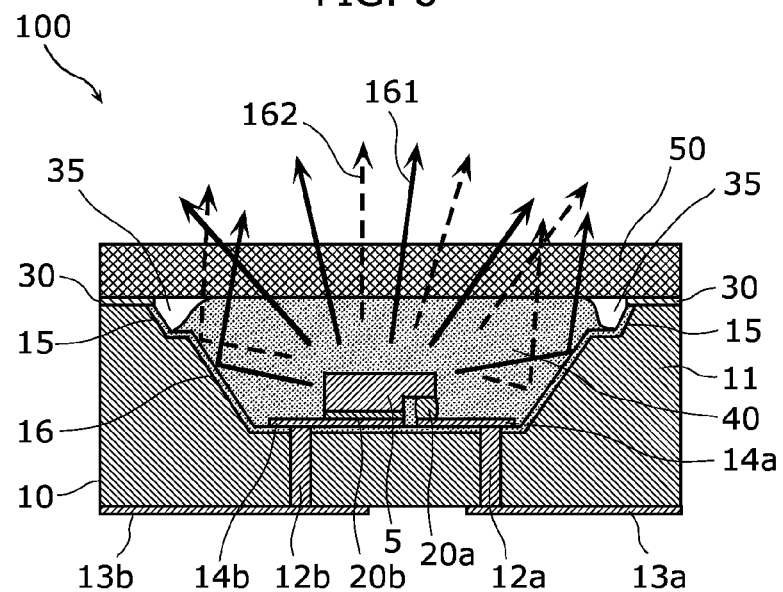
FIG. 6 is a cross-sectional view showing operations of the light-emitting device according to Embodiment 2 of the present invention.

FIG. 6 is a cross-sectional view for describing operations (emission directions of light) of the light-emitting device 100. In FIG. 6, outgoing light 161 having a peak wavelength of approximately 450 nm is emitted from the semiconductor light-emitting element 5. Part of the outgoing light 161 is converted into fluorescence 162 by the phosphor when the outgoing light 161 passes through the phosphor containing resin 40. The outgoing light 161 and the fluorescence 162 are emitted to outside the package 10 directly or after being reflected off the reflection film 16. At this time, most of the outgoing light 161 and the fluorescence 162 pass above the semiconductor light-emitting element 5. Thus, radiation of light is not obstructed due to difference in refractive index or the like by the cavity 35 disposed in the periphery.

Next, a method for manufacturing the light-emitting device 100 according to this embodiment is described with reference to FIG. 7A to FIG. 7D.

Each of FIG. 7A to FIG. 7D is a cross-sectional view showing a method for manufacturing the light-emitting device 100 according to this embodiment.

Figure 7A:
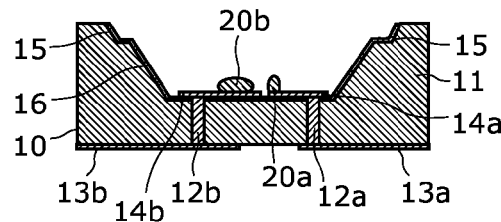
FIG. 7A is a cross-sectional view showing a method for manufacturing the light-emitting device according to Embodiment 2 of the present invention.

First, the package 10 is prepared, and bonded parts 20a and 20b are formed on the front side electrodes 14a and 14b which are positioned in the recess of the package 10. The bonded parts 20a and 20b are, for example, bumps which are, for example, made of gold tin (AuSn) alloy (FIG. 7A).

Figure 7B:
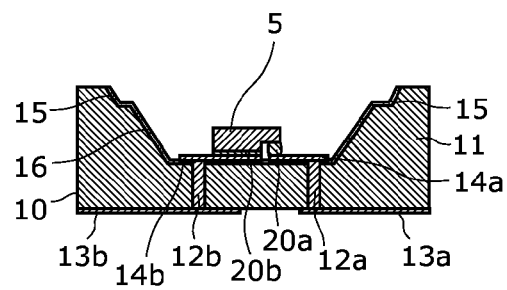
FIG. 7B is a cross-sectional view showing a method for manufacturing the light-emitting device according to Embodiment 2 of the present invention.

Subsequently, a p-type electrode and an n-type electrode in a gold (Au) layer, which is not shown in the figure, formed on the surface of the semiconductor light-emitting element 5 are aligned with the bonded parts 20a and 20b, and are bonded to the package 10 via the bonded parts 20a and 20b by pressing and heating. The semiconductor light-emitting element 5 is thus mounted. Subsequently, a fluoride resin or the like is formed on the reflection film 16 in the recess of the package 10 by, for example, electrodeposition (FIG. 7B).

Subsequently, on a top-most portion of an edge portion on the periphery of the package 10, the sealing component 30, which is, for example, an epoxy adhesive of ultraviolet curable type, is formed (applied) by potting to surround the recessed portion.

Figure 7C:
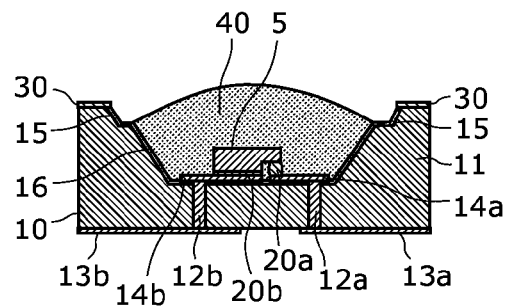
FIG. 7C is a cross-sectional view showing a method for manufacturing the light-emitting device according to Embodiment 2 of the present invention.

Subsequently, the package 10 is set in an atmosphere, such as nitrogen atmosphere or the like, which includes little oxygen. After this, the phosphor containing resin 40 that is an ultraviolet curable acrylic resin into which two types of quantum dot phosphor are mixed is dribbled to embed the semiconductor light-emitting element 5 in the recess of the package 10 (i.e., to cover the semiconductor light-emitting element 5 in the recess) and to fill the recess (FIG. 7C). At this time, the amount of the phosphor containing resin 40 dribbled is small relative to the volume of the recess, that is, the recess is not completely filled.

Subsequently, the cap component 50 is placed from above the package 10. The cap component 50 comprises a transparent resin such as acrylic resin or the like or glass or the like. The surface of the transparent resin, such as acrylic resin or the like, is treated to be water repellent. At this time, the phosphor containing resin 40 has a volume smaller than a volume of the recess, and thus the cavity 35 is formed in the recess. The cavity 35 is disposed on the side of the side surface of the package 10 (side surface of the recess) due to the surface tension of the phosphor containing resin 40.

Figure 7D:
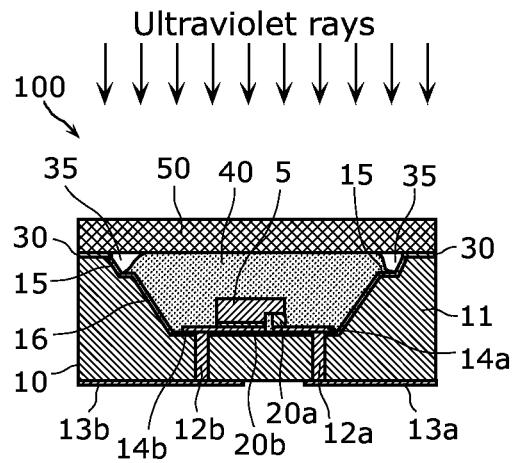
FIG. 7D is a cross-sectional view showing a method for manufacturing the light-emitting device according to Embodiment 2 of the present invention.

Subsequently, the sealing component 30 and the phosphor containing resin 40 are irradiated with ultraviolet rays via the cap component 50. The sealing component 30 and the phosphor containing resin 40 are thus cured (FIG. 7D). With this, the light-emitting device 100 shown in FIG. 5 is obtained.

With the manufacturing method according to FIG. 7A to FIG. 7D, the volume of the phosphor containing resin 40 can be small compared to the volume of the recess. Thus, it is possible to reduce the occurrence of a situation in which the volume of the phosphor containing resin 40 becomes greater than the volume of the recess due to variation in the dribble amount when the phosphor containing resin 40 is dribbled, causing the excessive phosphor containing resin 40 to invade the position of the sealing component 30 when the cap component 50 is adhered to the package 10. As a result, it becomes possible to reduce decrease in hermeticity of the light-emitting device caused by decrease in adhesive strength between the cap component 50 and the package 10.

Furthermore, a slight amount of oxygen that passes through the cap component 50 or the sealing component 30 while long storage or operation of the light-emitting device 100 can be gathered to the cavity 35 in the periphery of the recess with an effect of partial pressure. As a result, it is possible to reduce the deterioration of the phosphor which is caused by oxygen entering the phosphor containing resin.

Note that, although the reflection film 16 of the package 10 is treated to be water repellent in this embodiment, for example, the surface of the base material 11, which is a transparent resin such as acrylic resin or the like, in contact with the phosphor containing resin 40 may be treated to be water repellent as required.

Embodiment 3

Next, a light-emitting device according to Embodiment 3 of the present invention is described with reference to FIG. 8 and FIG. 9. The basic structure of the light-emitting device according to this embodiment is substantially the same as the structure of a light-emitting device according to Embodiment 1. Thus, descriptions are given only on the differences.

First, a structure of the light-emitting device according to Embodiment 3 of the present invention is described with reference to FIG. 8.

Figure 8:
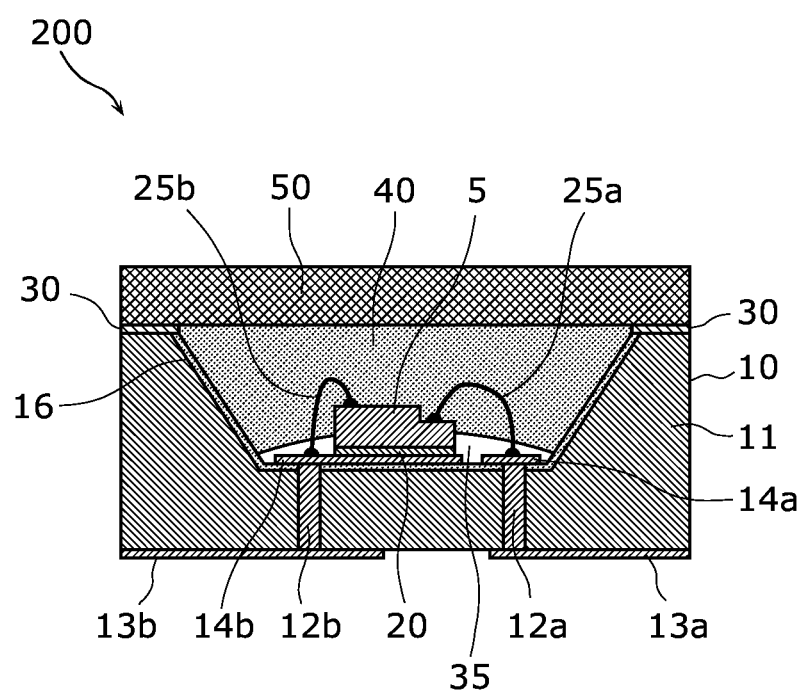
FIG. 8 is a cross-sectional view showing a structure of the light-emitting device according to Embodiment 3 of the present invention.

FIG. 8 is a cross-sectional view showing a structure of the light-emitting device 200 according to this embodiment.

The light-emitting device 200 includes: a semiconductor light-emitting element 5, a package 10, a bonded part 20, bonding wires 25a and 25b, a sealing component 30, a phosphor containing resin 40, and a cap component 50. The package 10 includes: a base material 11, via lines 12a and 12b, back side electrodes 13a and 13b, front side electrodes 14a and 14b, and a reflection film 16.

A light-emitting device 200 is different from a light-emitting device 1 according to Embodiment 1 in the inclusion of a cavity 35 described in Embodiment 2 and the position of the cavity 35. In this embodiment, the cavity 35 is positioned in a lower part of the recess. With this structure, when the outgoing light and the fluorescence emitted from the semiconductor light-emitting element 5 and the phosphor containing resin 40 are guided to outside from the light-emitting device 200, it is possible to reduce an adverse effect on the outgoing light and the fluorescence caused by the cavity 35 having a difference in refractive index.

Next, a method for manufacturing the light-emitting device 200 according to this embodiment is described with reference to FIG. 9.

Figure 9:
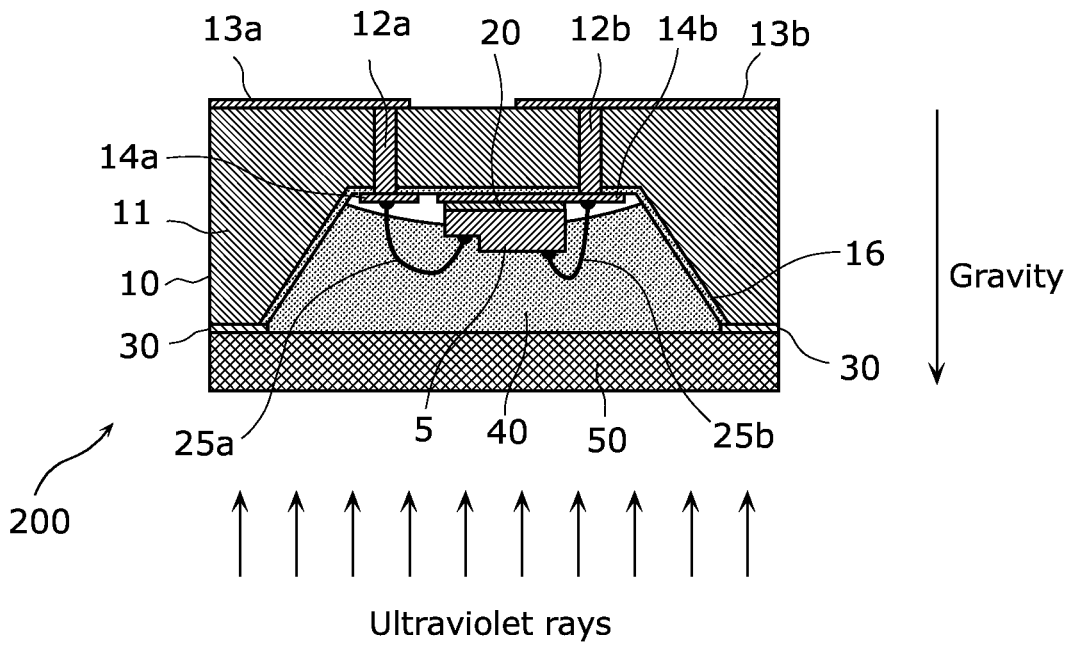
FIG. 9 is a cross-sectional view showing a method for manufacturing the light-emitting device according to Embodiment 3 of the present invention.

FIG. 9 is a cross-sectional view showing a method for manufacturing the light-emitting device 200 according to this embodiment. The manufacturing method according to this embodiment and the manufacturing method according to Embodiment 2 are different in the content of process of curing using ultraviolet rays which is performed after the cap component 50 is placed above the package 10. In the manufacturing method according to this embodiment, when the sealing component 30 and the phosphor containing resin 40 are cured through ultraviolet radiation, the cap component 50 is positioned underside relative to the package 10. In other words, the arrangement is made to allow the force toward the cap component 50 to be applied to the phosphor containing resin 40 as gravity, and the ultraviolet rays are irradiated from the underside (FIG. 9). With this method, it is possible to dispose the cavity 35 in the lower part of the recess.

Embodiment 4

Next, a light-emitting device according to Embodiment 4 of the present invention is described with reference to FIG. 10 to FIG. 13. The basic structure of the light-emitting device according to this embodiment is substantially the same as the structure of the light-emitting device according to Embodiment 2. Thus, descriptions are given only on the differences. A feature of the light-emitting device according to this embodiment is that a plurality of layers including phosphor is formed in the light-emitting device. This structure makes it possible to select a phosphor material more freely.

First, a structure of the light-emitting device according to Embodiment 4 of the present invention is described with reference to FIG. 10.

Figure 10:
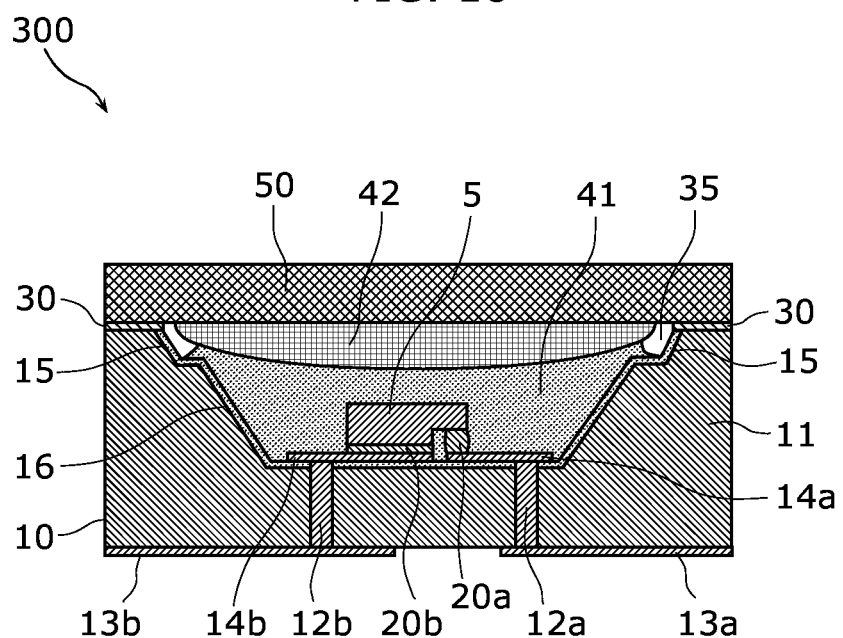
FIG. 10 is a cross-sectional view showing a structure of the light-emitting device according to Embodiment 4 of the present invention.

FIG. 10 is a cross-sectional view showing a structure of a light-emitting device 300 according to this embodiment.

The light-emitting device 300 includes: a semiconductor light-emitting element 5, a package 10, bonded parts 20a and 20b, a sealing component 30, a first phosphor containing resin 41, a second phosphor containing resin 42, and a cap component 50. The package 10 includes: a base material 11, via lines 12a and 12b, back side electrodes 13a and 13b, front side electrodes 14a and 14b, and a reflection film 16. Phosphor is mixed into different resin materials of the first phosphor containing resin 41 and the second phosphor containing resin 42. For example, at least one of the phosphor included in the first phosphor containing resin 41 and the second phosphor containing resin 42 includes a plurality of types of phosphor particle. For example, at least one of the phosphor included in the first phosphor containing resin 41 and the second phosphor containing resin 42 is quantum dot phosphor. For example, the phosphor of types, which is included in at least one of the first phosphor containing resin 41 and the second phosphor containing resin 42, is enclosed in a space sealed with the sealing component 30. For example, at least one type of phosphor included in at least one of the first phosphor containing resin 41 and the second phosphor containing resin 42 includes a rare-earth activated phosphor material.

In this embodiment, the second phosphor containing resin 42 is disposed between the first phosphor containing resin 41 and the cap component 50. In other words, as a plurality of types of phosphor containing resins, the first phosphor containing resin 41 and the second phosphor containing resin 42 are disposed in a space in the recess between the cap component 50 and the package 10. With this structure, different phosphor can be formed in layers in different regions in the recess. This makes it possible to freely design the emission spectrum of the light-emitting device 300.

Figures 11A, 11B:
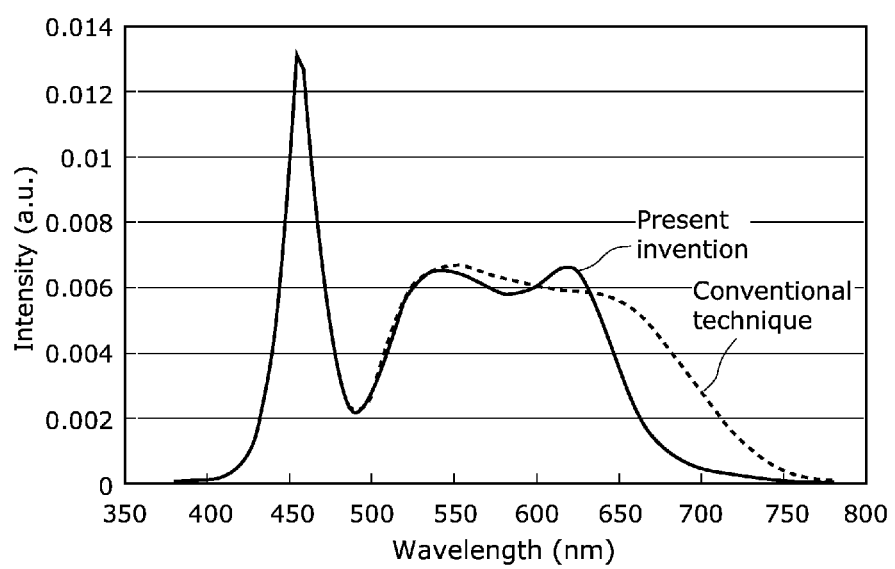
FIG. 11A is a graph showing an emission spectrum of the light-emitting device according to Embodiment 4 of the present invention.
FIG. 11B is a table which shows chromaticity coordinates and average color rendering index of the light-emitting device according to Embodiment 4 of the present invention.

In this embodiment, the phosphor included in the second phosphor containing resin 42 can be rare-earth activated phosphor, such as YAG:Ce or the like, and the phosphor included in the first phosphor containing resin 41 can be quantum dot phosphor, such as InP/ZnS or the like. FIG. 11A shows an example (the result of calculation) of the emission spectrum of the light-emitting device 300, which is designed based on the above structure. It is assumed that the quantum dot phosphor has a peak wavelength of outgoing light of 625 nm, and spectrum full-width at half-maximum of 50 nm. With an adjustment of phosphor, as shown in FIG. 11B, chromaticity coordinates of x=0.336 and y=0.333, and average color rendering index of 92 can be achieved. This indicates that the present invention can significantly reduce the light having the wavelength greater than or equal to 680 nm, while achieving the average color rendering index substantially equal to the average color rendering index of the conventional technique.

Next, a method of manufacturing the light-emitting device 300 according to this embodiment is described with reference to FIG. 12.

Figure 12:
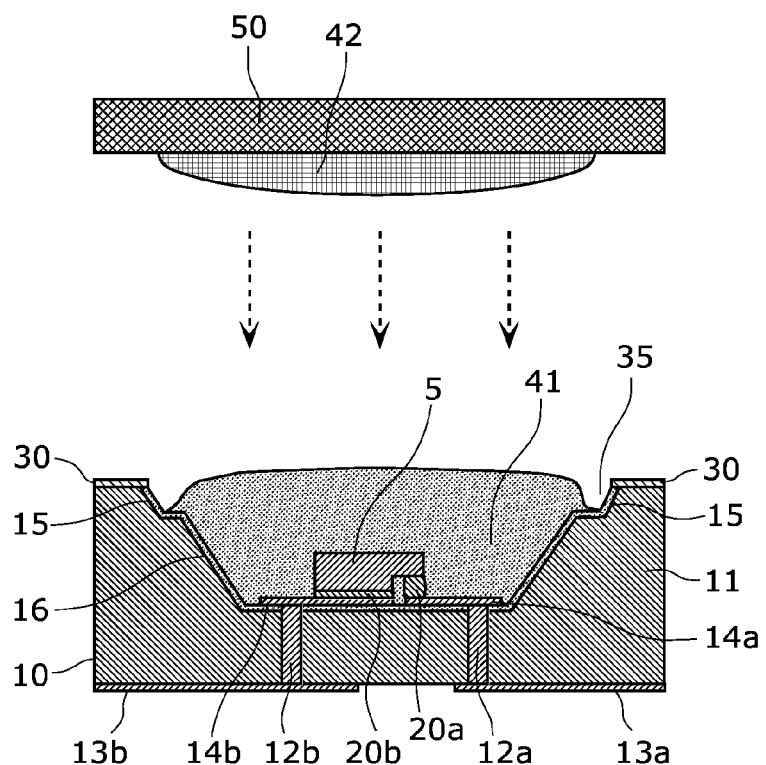
FIG. 12 is a cross-sectional view showing a method for manufacturing the light-emitting device according to Embodiment 4 of the present invention.

FIG. 12 is a cross-sectional view showing a method of manufacturing the light-emitting device 300 according to this embodiment. In the manufacturing method according to this embodiment, a transparent component is used as the cap component 50. On a surface of the transparent component, the second phosphor containing resin 42, which includes rare-earth phosphor and is cured, is formed beforehand. At this time, the cap component 50 that includes the second phosphor containing resin 42 can be manufactured in an atmosphere. The first phosphor containing resin 41 and the second phosphor containing resin 42 can be hermetically sealed using the above-described cap component 50, in a similar manner as Embodiments 1 to 3.

Figure 13:
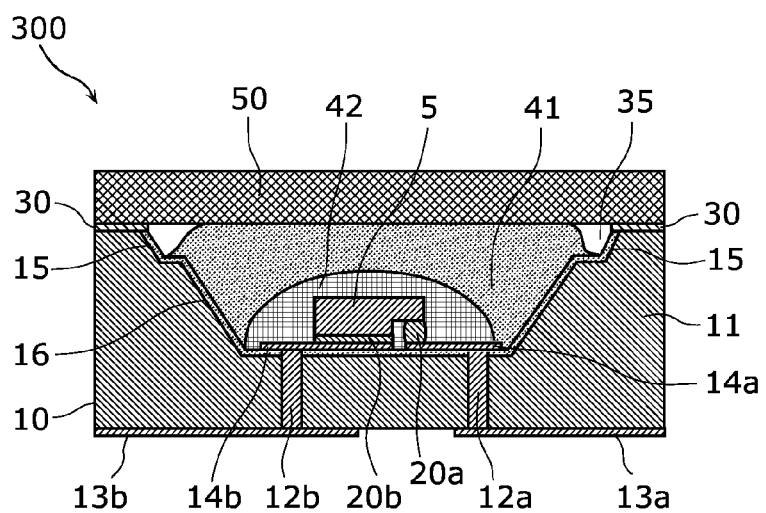
FIG. 13 is a cross-sectional view showing a variation of the light-emitting device according to Embodiment 4 of the present invention.

Next, a variation of this embodiment is described with reference to FIG. 13. This variation is different from this embodiment in that the second phosphor containing resin 42 is disposed to cover the semiconductor light-emitting element 5. Use of the structure according to this variation makes it possible to design an emission spectrum equivalent to the emission spectrum according to this embodiment. In addition, the structure according to this variation makes it possible to arrange the first phosphor containing resin 41 and the second phosphor containing resin 42 more freely according to optical output and the amount of heat emitted from the semiconductor light-emitting element 5. Furthermore, in the manufacturing method according to this variation, the first phosphor containing resin 41 and the second phosphor containing resin 42 are formed by, for example, in FIG. 7C, dribbling an appropriate amount of the second phosphor containing resin 42 and curing the second phosphor containing resin 42 first, and after this, dribbling the first phosphor containing resin 41 and then providing a seal with the cap component 50. In this manner, the manufacturing method according to this variation can make it more easy to increase, in the light-emitting device, the number of layers which include phosphor.

Embodiment 5

Next, a light-emitting device according to Embodiment 5 of the present invention is described with reference to FIG.

14. The basic structure of the light-emitting device according to this embodiment is substantially the same as the structure of a light-emitting device according to Embodiment 2. Thus, descriptions are given only on the differences.

Figure 14:
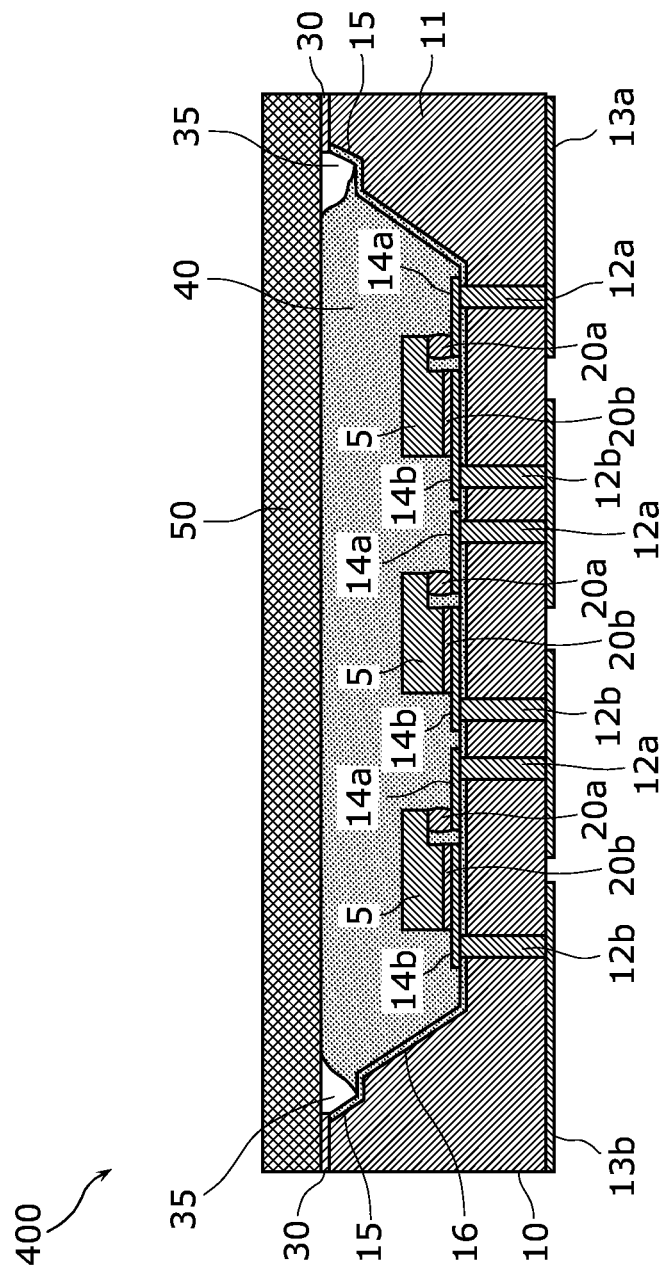
FIG. 14 is a cross-sectional view showing a structure of a light-emitting device according to Embodiment 5 of the present invention.

FIG. 14 is a cross-sectional view showing a structure of a light-emitting device 400 according to this embodiment.

The light-emitting device 400 includes: a plurality of semiconductor light-emitting elements 5, a package 10, bonded parts 20a and 20b, a sealing component 30, a phosphor containing resin 40, and a cap component 50. The package 10 includes: a base material 11, via lines 12a and 12b, back side electrodes 13a and 13b, front side electrodes 14a and 14b, and a reflection film 16.

The semiconductor light-emitting elements 5 are mounted in the light-emitting device 400. In this embodiment, the number of the semiconductor light-emitting elements 5 can be increased, and thus light output from the light-emitting device 400 can be increased. On the other hand, the amount of gas entering through the cap component 50 increases. However, the amount of gas entering through the cap component 50 can be controlled by using the design parameter described in Embodiment 1, which makes it possible to reduce deterioration of the phosphor and deterioration of the properties of the light-emitting device 400.

Furthermore, in this embodiment, the phosphor containing resin 40 into which rare-earth phosphor, such as YAG:Ce or the like, is mixed is disposed on the face, which faces the package 10, of the cap component 50. With this structure, only the phosphor which is vulnerable to gas and moisture can be hermetically sealed in the recess of the package 10. Thus, the light-emitting device can be efficiently designed.

Embodiment 6

Next, a light-emitting device according to Embodiment 6 of the present invention is described with reference to FIG. 15. The basic structure of the light-emitting device according to this embodiment is substantially the same as the structure of a light-emitting device according to Embodiment 5. Thus, descriptions are given only on the differences.

Figure 15:
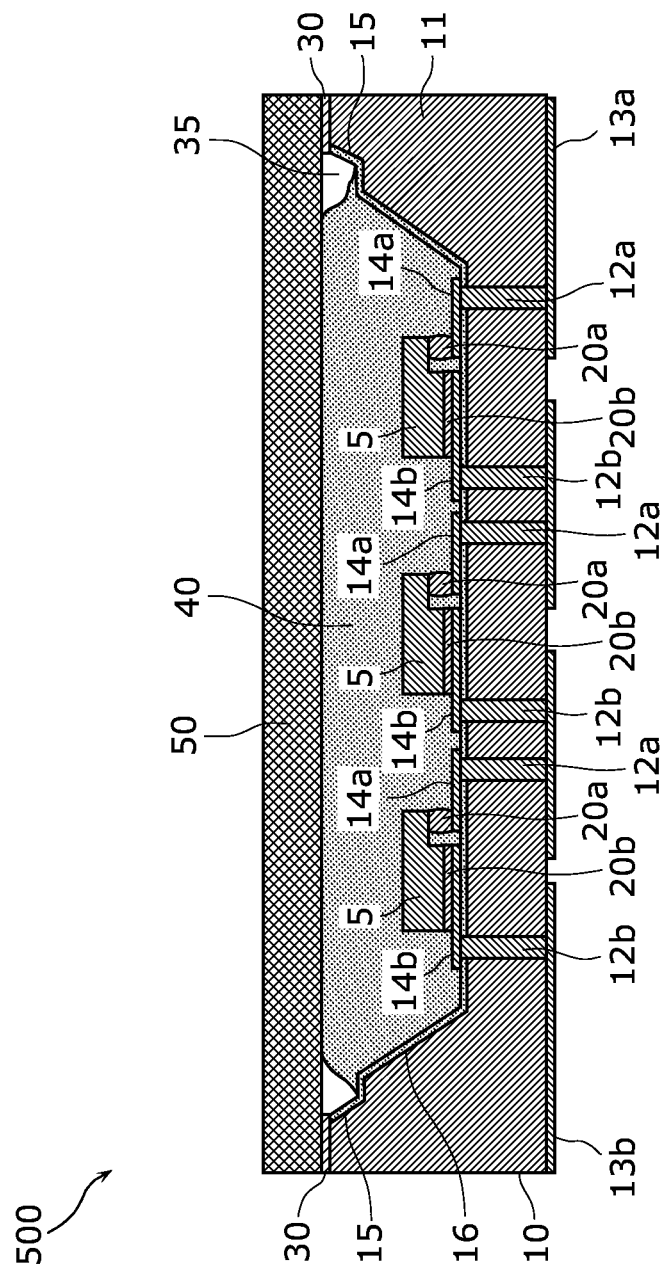
FIG. 15 is a cross-sectional view showing a structure of a light-emitting device according to Embodiment 6 of the present invention.
Figure 16:
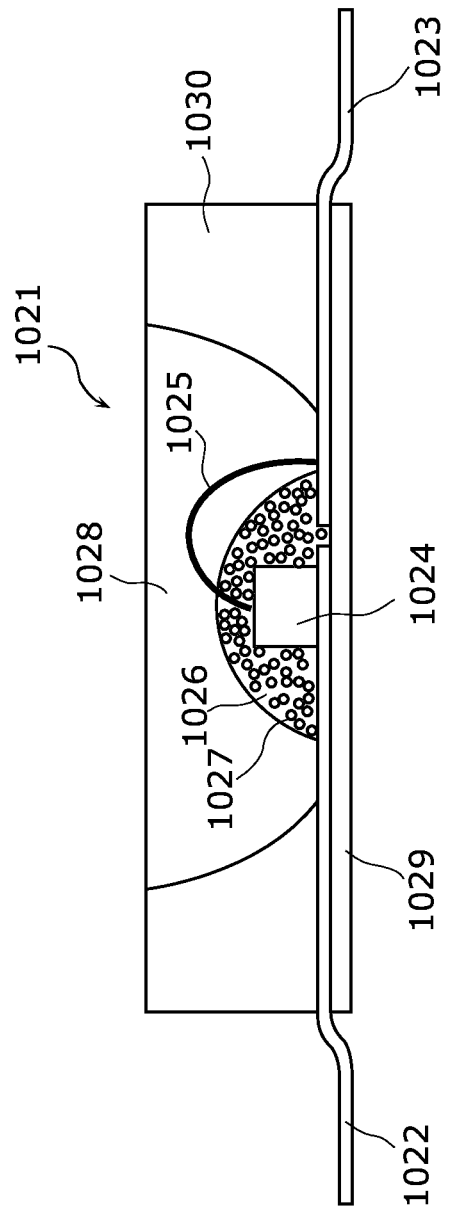
FIG. 16 is a diagram showing a structure of a light-emitting device according to a conventional example.
Figure 17:
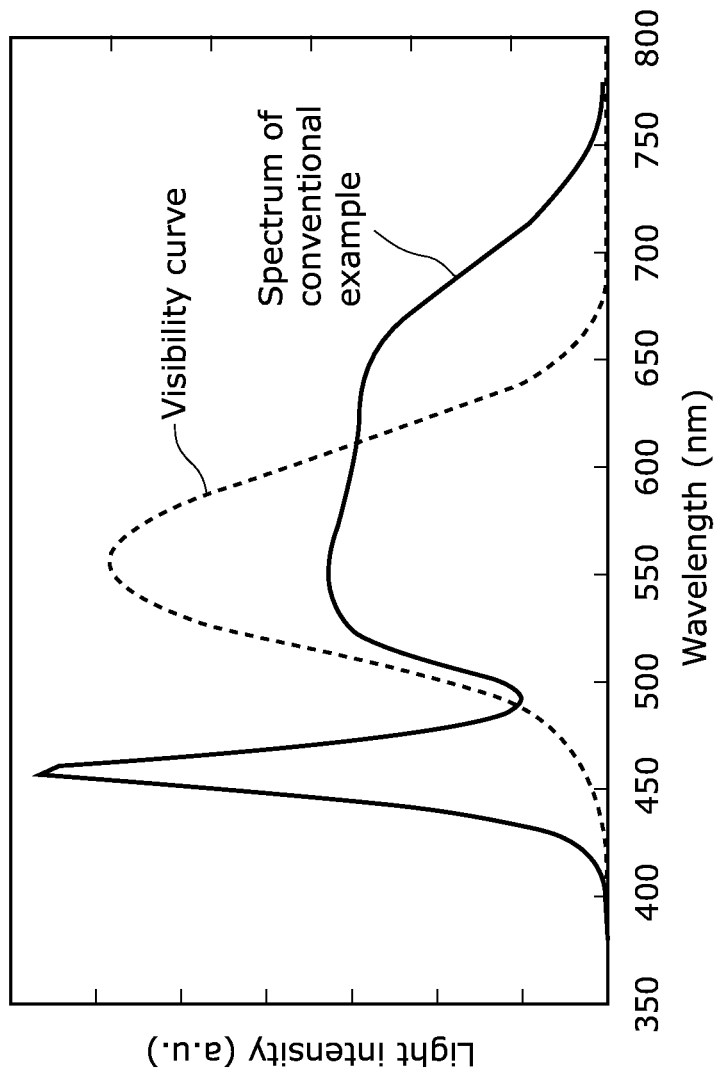
FIG. 17 is a graph showing an emission spectrum of the light-emitting device according to the conventional example.

FIG. 15 is a cross-sectional view showing a structure of a light-emitting device 500 according to this embodiment.

The light-emitting device 500 includes: a plurality of semiconductor light-emitting elements 5, a package 10, bonded parts 20a and 20b, a sealing component 30, a phosphor containing resin 40, and a cap component 50. The package 10 includes: a base material 11, via lines 12a and 12b, back side electrodes 13a and 13b, front side electrodes 14a and 14b, and a reflection film 16. The cap component 50 includes phosphor.

The light-emitting device 500 is different from a light-emitting device described according to Embodiment 5 in that the cap component 50 described in Embodiment 5 is replaced with a cap component 50 which is obtained by adding rare-earth phosphor to the transparent component. With this structure, the cap component 50 can include both functions of providing an effect of a cap which protects the phosphor containing resin from gas and moisture, and a function of emitting fluorescence by including the phosphor. This makes it possible to configure the light-emitting device effectively.

Although the light-emitting device according to the present invention is described based on some embodiments, the present invention is not limited to such embodiments. Various modifications that may be conceived by those skilled in the art which do not depart from the essence of the present invention are intended to be included within the scope of the present invention. Furthermore, respective structural elements of different embodiments may be arbitrarily combined within the scope of the essence of the present invention.

For example, in the above-described embodiment, the recess is provided in the package, and the phosphor containing resin is disposed in a space in the recess. However, the structure is not limited to the above, and it is sufficient that the phosphor containing resin be disposed in a space between the package and the cap component which are sealed with the sealing component. Therefore, (i) a recess may be formed in the cap component, and the phosphor containing resin may be disposed in a space in the recess or (ii) a gap may be formed between the cap component and the package, and the phosphor containing resin may be disposed in a space in the gap.

INDUSTRIAL APPLICABILITY

The present invention can realize a light-emitting device having superior color rendition and thus, for example, is useful not only for a household lighting apparatus but also for a lighting apparatus for displaying which is used when groceries are displayed, a backlight light source of a large-screen liquid crystal television that requires sharpness in the displayed image, or the like.

The invention claimed is:

1. A light-emitting device comprising:
a package;
a semiconductor light-emitting element mounted above the package;
a cap component provided above the package;
a sealing component which seals a space between the package and the cap component; and
phosphor disposed in the sealed space,
wherein a surface of at least one of the cap component and the package is treated to be water repellent, the surface facing the semiconductor light-emitting element.

2. The light-emitting device according to claim 1, wherein a cavity including gas is formed in the sealed space.

3. The light-emitting device according to claim 2, wherein the cavity includes gas other than oxygen or is a vacuum.

4. The light-emitting device according to claim 1, wherein the package has a structure in which a metal line is embedded in a ceramic material.

5. The light-emitting device according to claim 1, wherein the cap component comprises a translucent acrylic resin or a translucent epoxy resin.

6. The light-emitting device according to claim 1, wherein the cap component comprises translucent glass.

7. The light-emitting device according to claim 1, wherein the phosphor includes a plurality of types of phosphor particles.

8. The light-emitting device according to claim 1, wherein the phosphor is quantum dot phosphor.

9. The light-emitting device according to claim 7, wherein the phosphor particles of the types are enclosed in the sealed space.

10. The light-emitting device according to claim 1, wherein at least one of types of the phosphor includes a rare-earth activated phosphor material.

11. The light-emitting device according to claim 1, wherein the phosphor is mixed into different resin materials.

12. The light-emitting device according to claim 1, wherein the cap component includes phosphor.

13. The light-emitting device according to claim 1, wherein the surface of at least one of the cap component and the package is treated with fluoride resin to be water repellent.

14. The light-emitting device according to claim 1, further comprising:

a reflection film disposed between the package and the semiconductor light-emitting element, wherein a surface of the reflection film is treated to be water repellent, the surface of the reflection film facing the semiconductor light-emitting element.

15. The light-emitting device according to claim 14, wherein the surface of the reflection film is treated with fluoride resin to be water repellent.

16. The light-emitting device according to claim 2, wherein the package includes a step portion such that the cavity is formed between the step portion and the cap component.

17. The light-emitting device according to claim 16, further comprising:

a reflection film disposed between the package and the semiconductor light-emitting element, the reflection film disposed on the step portion, wherein a surface of the reflection film is treated to be water repellent, the surface of the reflection film facing the semiconductor light-emitting element.

18. The light-emitting device according to claim 17, wherein the surface of the reflection film is treated with fluoride resin to be water repellent.

19. The light-emitting device according to claim 2, wherein the cavity includes nitrogen component.

20. The light-emitting device according to claim 16, wherein the cavity includes nitrogen component.

* * * * *